United States Patent

Matsumura

(10) Patent No.: US 9,665,015 B2
(45) Date of Patent: May 30, 2017

(54) ORIGINAL HOLDING APPARATUS, EXPOSURE APPARATUS, METHOD OF MANUFACTURING ARTICLE AND ORIGINAL HOLDING METHOD

(71) Applicant: CANON KABUSHIKI KAISHA, Tokyo (JP)

(72) Inventor: Yuuhei Matsumura, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 191 days.

(21) Appl. No.: 14/532,601

(22) Filed: Nov. 4, 2014

(65) Prior Publication Data
US 2015/0131073 A1 May 14, 2015

(30) Foreign Application Priority Data

Nov. 8, 2013 (JP) .................................. 2013-232581

(51) Int. Cl.
| | |
|---|---|
| B23B 5/34 | (2006.01) |
| G03B 27/32 | (2006.01) |
| G03B 27/62 | (2006.01) |
| G03F 7/20 | (2006.01) |
| H01L 21/687 | (2006.01) |

(52) U.S. Cl.
CPC ............ G03F 7/707 (2013.01); H01L 21/687 (2013.01); H01L 21/68728 (2013.01)

(58) Field of Classification Search
CPC ..... G03B 27/64; G03F 7/70691; G03F 7/707; G03F 7/70733; H01L 21/687; H01L 21/68728

USPC .......................................... 279/3; 355/75–77
See application file for complete search history.

(56) References Cited

U.S. PATENT DOCUMENTS

| 8,456,618 | B2 | 6/2013 | Koike | |
|---|---|---|---|---|
| 2003/0016338 | A1* | 1/2003 | Yasuda | ................... G03B 27/52 355/55 |
| 2003/0197841 | A1* | 10/2003 | Araki | ...................... G03B 27/42 355/75 |
| 2007/0188723 | A1* | 8/2007 | Luttikhuis | .............. G03B 27/42 355/53 |

FOREIGN PATENT DOCUMENTS

| JP | 2000299370 A | * 10/2000 |
|---|---|---|
| JP | 2011-023425 A | 2/2011 |

* cited by examiner

*Primary Examiner* — Colin Kreutzer
(74) *Attorney, Agent, or Firm* — Rossi, Kimms & McDowell LLP

(57) ABSTRACT

The present invention provides an original holding apparatus which holds an original, comprising a first holding unit configured to hold the original, a second holding unit configured to hold the original, a fixing unit configured to fix the second holding unit, and an adjustment unit configured to perform adjustment of an holding force of at least one of the first holding unit and the second holding unit, wherein the adjustment unit performs the adjustment such that the holding force of the second holding unit before fixing the second holding unit is smaller than the holding force of the first holding unit before fixing the second holding unit, and performs the adjustment such that the holding force of the second holding unit after fixing the second holding unit is larger than that before fixing the second holding unit.

23 Claims, 10 Drawing Sheets

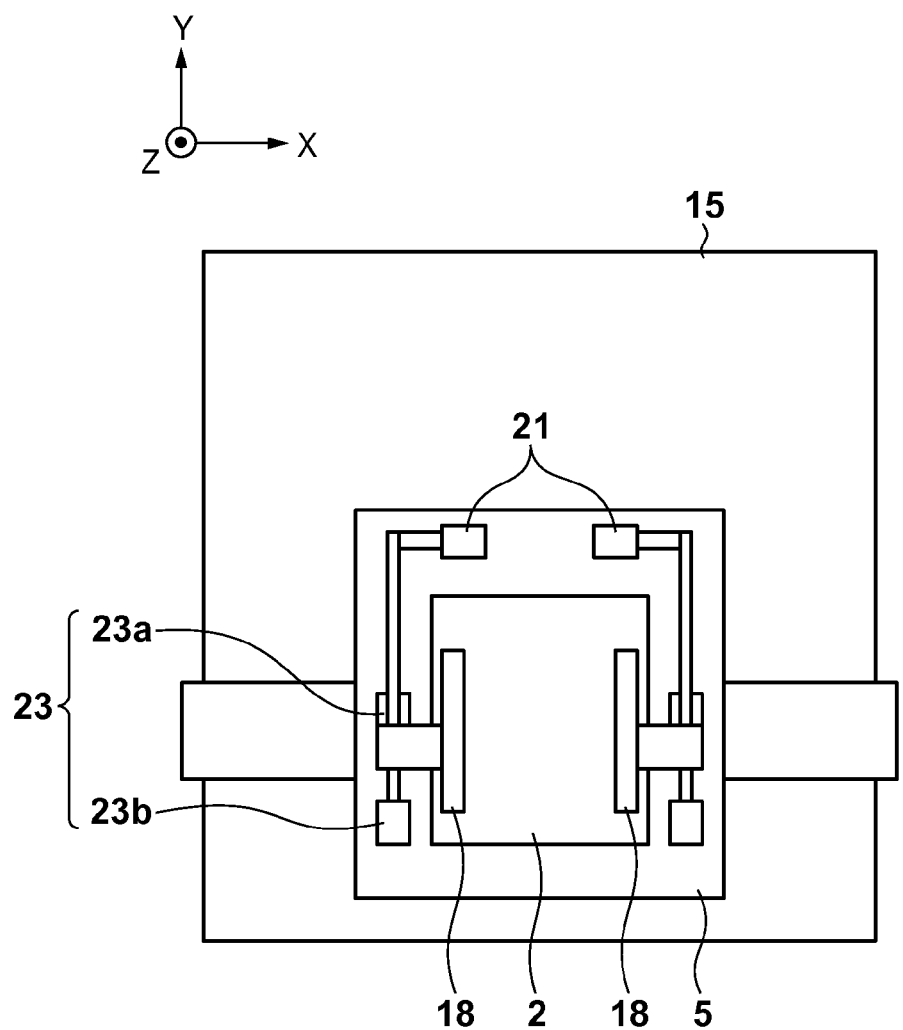
F I G. 2

F I G. 7
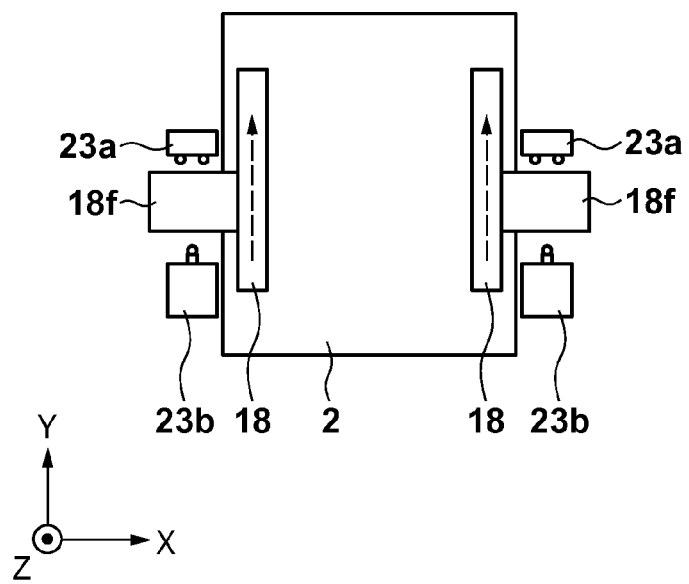
F I G. 8
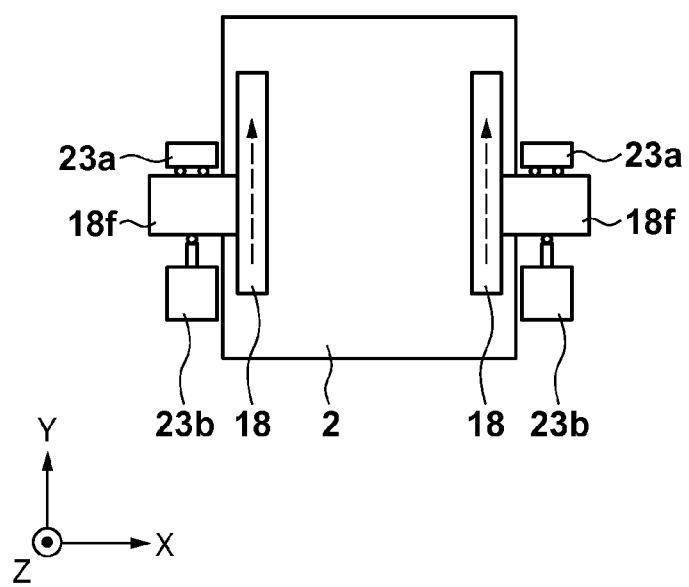

F I G. 12
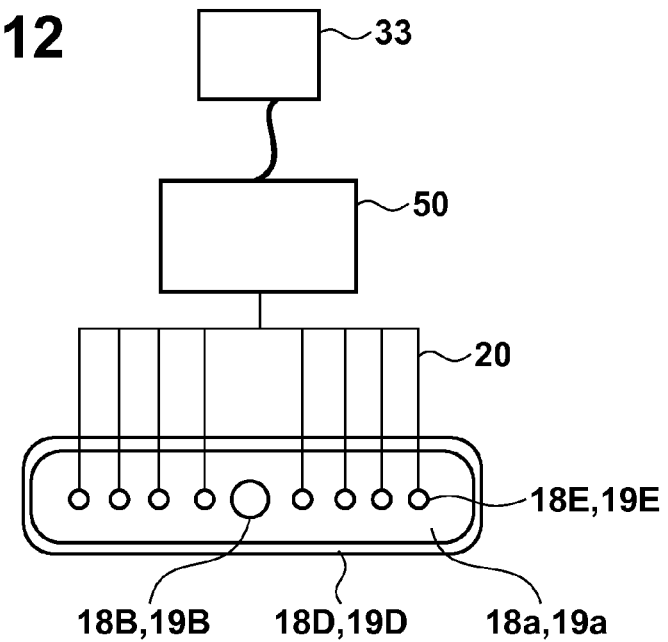
F I G. 13
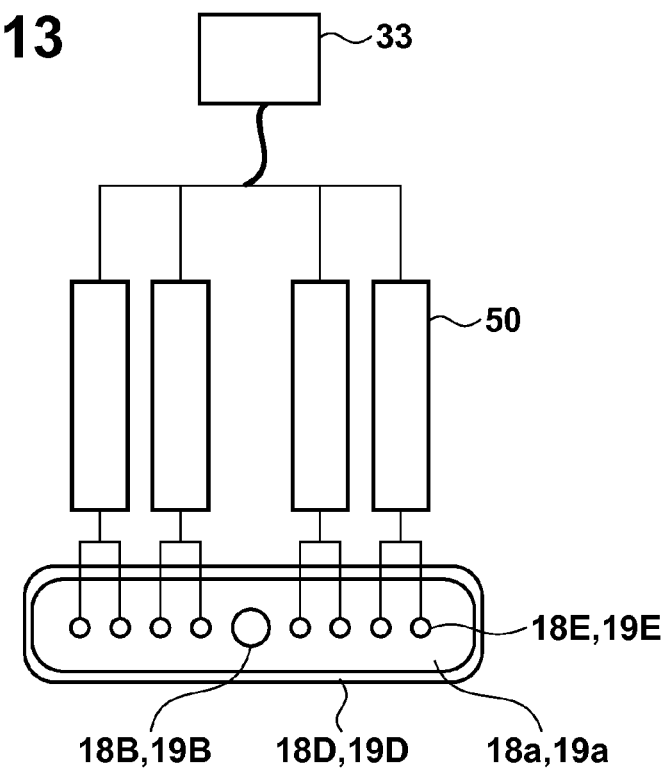

ORIGINAL HOLDING APPARATUS, EXPOSURE APPARATUS, METHOD OF MANUFACTURING ARTICLE AND ORIGINAL HOLDING METHOD

BACKGROUND OF THE INVENTION

Field of the Invention

The present invention relates to an original holding apparatus which holds an original, an exposure apparatus, a method of manufacturing an article, and an original holding method.

Description of the Related Art

One of apparatuses used in the manufacturing process (lithography process) of a semiconductor device or the like is an exposure apparatus which transfers the pattern of an original to a substrate during scanning slit light on the substrate. To improve productivity, the exposure apparatus needs to increase the acceleration of an original stage which holds the original. However, if the acceleration of the original stage is increased, a force applied between the original stage and the original by the acceleration of the original stage exceeds a force for holding the original by the original stage, and a slip may occur between the original and the original stage. To prevent this, Japanese Patent Laid-Open No. 2011-23425 has proposed an original stage in which the force for holding an original is increased by vacuum-chucking both the upper and lower surfaces of the original.

The original stage disclosed in Japanese Patent Laid-Open No. 2011-23425 includes fixing unit which fix second holding unit with respect to first holding unit so that the relative position of the first holding unit for vacuum-chucking the lower surface of the original, and the second holding unit for vacuum-chucking the upper surface of the original does not change during scanning exposure of the substrate. However, according to Japanese Patent Laid-Open No. 2011-23425, when the fixing unit fixes the second holding unit on the original stage in a state in which the chucking force of the first holding unit and the chucking force of the second holding unit are set to be equal to each other, the second holding unit may be displaced with respect to the first holding unit so as to damage the original. Japanese Patent Laid-Open No. 2011-23425 does not disclose a technique of controlling the chucking force of the first holding unit and the chucking force of the second holding unit to reduce the possibility at which an original is damaged when fixing the second holding unit by the fixing unit.

SUMMARY OF THE INVENTION

The present invention provides, for example, a technique advantageous for reducing the possibility at which an original is damaged when holding the original.

According to one aspect of the present invention, there is provided an original holding apparatus which holds an original, comprising: a first holding unit configured to hold the original; a second holding unit, being movable with respect to the first holding unit, configured to hold the original; a fixing unit configured to fix the second holding unit with respect to the first holding unit; and an adjustment unit configured to perform adjustment of at least one of an original holding force of the first holding unit and an original holding force of the second holding unit, wherein the adjustment unit performs the adjustment such that the original holding force of the second holding unit before fixing the second holding unit by the fixing unit is smaller than the original holding force of the first holding unit before fixing the second holding unit by the fixing unit, and performs the adjustment such that the original holding force of the second holding unit after fixing the second holding unit by the fixing unit is larger than the original holding force of the second holding unit before fixing the second holding unit by the fixing unit.

Further features of the present invention will become apparent from the following description of exemplary embodiments with reference to the attached drawings.

BRIEF DESCRIPTION OF THE DRAWINGS

FIG. 2 is a view showing an original stage apparatus when viewed from the Z direction;

FIG. 7 is a view showing fixing units before fixing the upper surface clamps;

FIG. 8 is a view showing the fixing units in a state in which the upper surface clamps are fixed;

FIG. 12 is a view showing an example of the arrangement of a portion of the upper surface clamp (lower surface chuck) that contacts the surface of an original, and a pressure regulating unit;

FIG. 13 is a view showing an example of the arrangement of the portion of the upper surface clamp (lower surface chuck) that contacts the surface of an original, and the pressure regulating unit;

DESCRIPTION OF THE EMBODIMENTS

Figure 1:
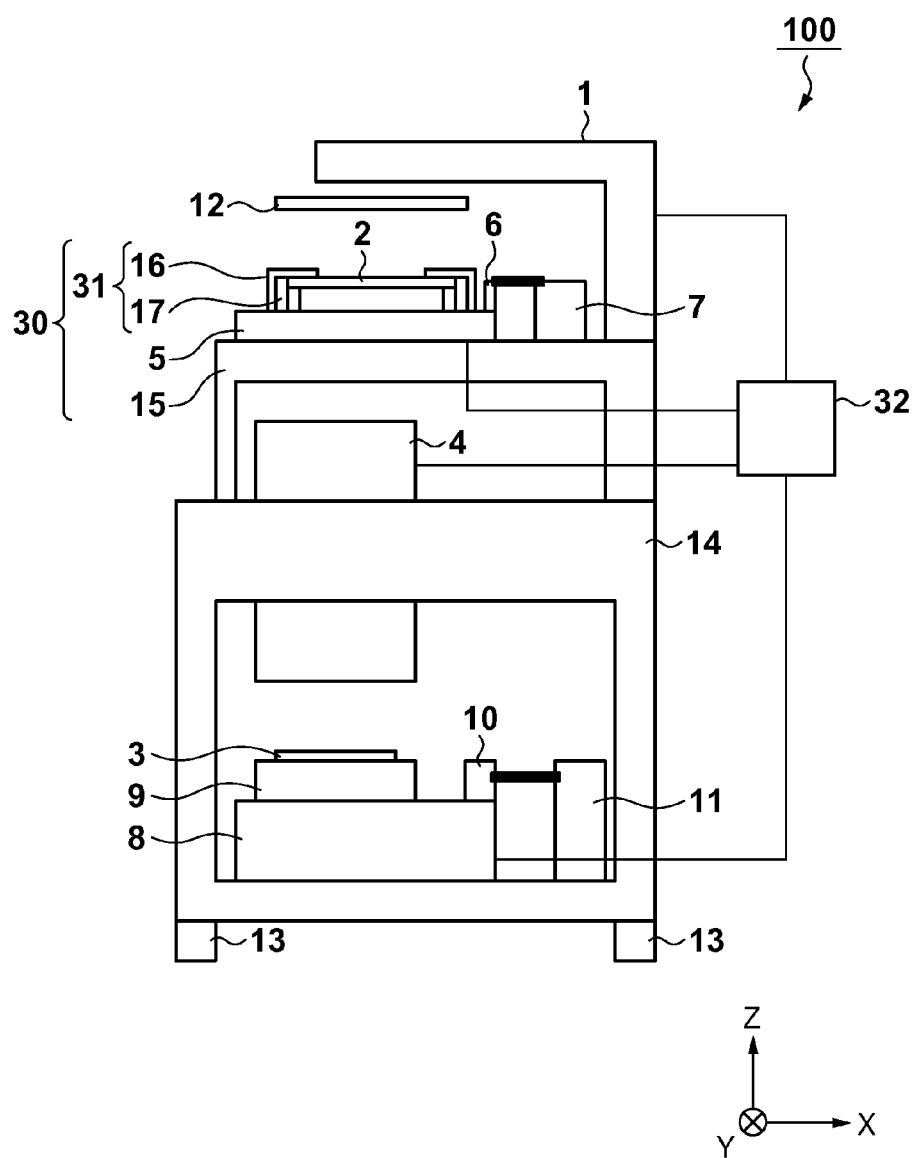
FIG. 1 is a schematic view showing the arrangement of an exposure apparatus according to the first embodiment.

Exemplary embodiments of the present invention will be described below with reference to the accompanying drawings. Note that the same reference numerals denote the same members throughout the drawings, and a repetitive description thereof will not be given.

First Embodiment

Exposure Apparatus

An exposure apparatus 100 according to the first embodiment will be explained with reference to FIG. 1. FIG. 1 is a schematic view showing the arrangement of the exposure apparatus 100. The exposure apparatus 100 shown in FIG. 1 is a step & scan type scanning exposure apparatus which scans and exposes a substrate 3 with slit light. The exposure apparatus 100 includes an illumination system 1 which changes exposure light emitted by a light source (mercury vapor lamp or laser source) into a slit-shaped beam (slit light), a projection optical system 4 which reduces and projects, onto the substrate 3, the pattern of an original 2 (for example, reticle) illuminated with the slit light, and a control unit (adjustment unit) 32. The original 2 is mounted on an original stage apparatus 30 so that a pattern surface having a pattern faces the exposure target surface of the substrate 3 via the projection optical system 4. The original stage apparatus 30 can include an original holding apparatus 31 which holds the original 2, and an original stage 5 capable of moving in the lateral direction (for example, Y direction) while mounting the original holding apparatus 31. The original holding apparatus 31 can include a first holding unit 17 which holds the original 2 by chucking the lower surface (first surface), that is, pattern surface of the original 2, and a second holding unit 16 which holds the original 2 by chucking the upper surface (second surface opposite to the first surface) of the original. A reflecting mirror 6 is mounted on the original stage 5, and a laser interferometer 7 measures the position of the original stage 5 via the reflecting mirror 6. The control unit (adjustment unit) 32 includes a CPU and memory, adjusts the original holding force of the first holding unit 17 and the original holding force of the second holding unit 16, and controls exposure processing (controls each unit of the exposure apparatus 100).

The substrate 3 is held by a substrate chuck 9 mounted on a substrate stage 8. A bar mirror 10 is arranged on the substrate stage 8, and a laser interferometer 11 measures the position of the substrate stage 8 via the bar mirror 10. An alignment detection unit 12 for detecting the relative positions of the original 2 and substrate 3 is arranged above the original 2. The exposure apparatus 100 performs scanning exposure while synchronizing the positions of the original 2 and substrate 3 by using the alignment detection unit 12. The overall exposure apparatus 100 is supported by a main body frame 14 mounted on a shock-absorbing table 13. The original stage 5 moves on a structure 15 arranged on the main body frame 14. A pattern is formed on the original 2. This pattern is projected to the substrate 3 through the projection optical system 4 to expose the substrate 3.

Original Stage Apparatus

Next, the original stage apparatus 30 which holds an original will be explained. FIG. 2 is a view showing the original stage apparatus 30 in the above-described exposure apparatus 100 when viewed from the Z direction. In FIG. 2, the original 2 is held by the original holding apparatus 31 mounted on the original stage 5. The original stage 5 is arranged on the structure 15, and is movable on the structure 15 in a direction (for example, Y direction) parallel to the surfaces (first and second surfaces) of the original 2. In the original stage apparatus 30, the original holding apparatus 31 which holds the peripheral portion (outside portion or outer edge portion of the pattern portion) of the original 2 may be constituted not by one unit, but by a plurality of units.

Figure 3:
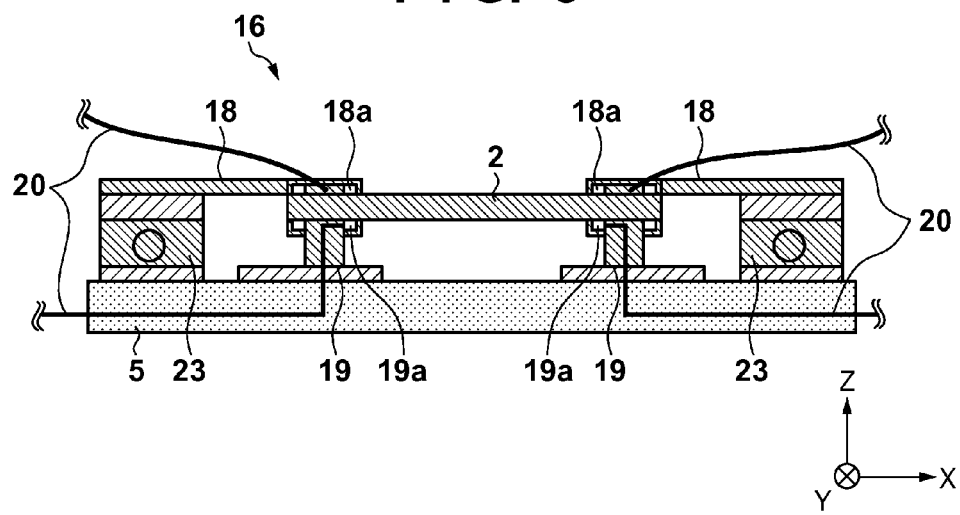
FIG. 3 is a sectional view showing an original holding apparatus in a state in which an original is held by lower surface chucks and upper surface clamps.
Figure 4:
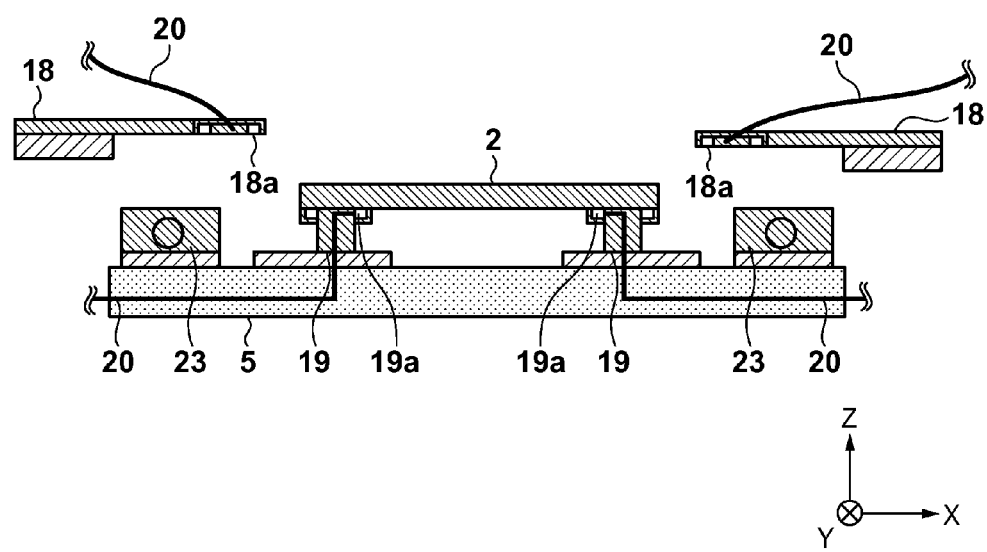
FIG. 4 is a sectional view showing the original holding apparatus in a state in which the upper surface clamps are evacuated.

FIG. 3 is a sectional view showing the original holding apparatus 31 in a state in which the original 2 is held by lower surface chucks 19 serving as the first holding unit 17, and upper surface clamps 18 serving as the second holding unit 16. FIG. 4 is a sectional view showing the original holding apparatus 31 in a state in which the upper surface clamps 18 are evacuated at the time of, for example, exchanging the original 2. Each upper surface clamp 18 includes a vacuum trench 18a (first enclosed space) formed in a surface which contacts the upper surface of the original 2. Each lower surface chuck 19 includes a vacuum trench 19a (second enclosed space) formed in a surface which contacts the lower surface of the original 2. A space defined by the vacuum trench 18a of the upper surface clamp 18 is connected to a vacuum source 33 arranged outside the original stage apparatus 30, via a corresponding pressure regulating unit 50 (for example, vacuum valve) which regulates the internal pressure of the vacuum trench 18a, and a corresponding pipe 20. Similarly, a space defined by the vacuum trench 19a of the lower surface chuck 19 is connected to the vacuum source 33 arranged outside the original stage apparatus 30, via the corresponding pressure regulating unit 50 (for example, vacuum valve) which regulates the internal pressure of the vacuum trench 19a, and the corresponding pipe 20. The pipes 20 constitute parts of the first suction mechanism and second suction mechanism which suck air from the vacuum trenches 18a and 19a in order to vacuum-chuck the original 2 by the respective vacuum trenches 18a and 19a.

Figure 5:
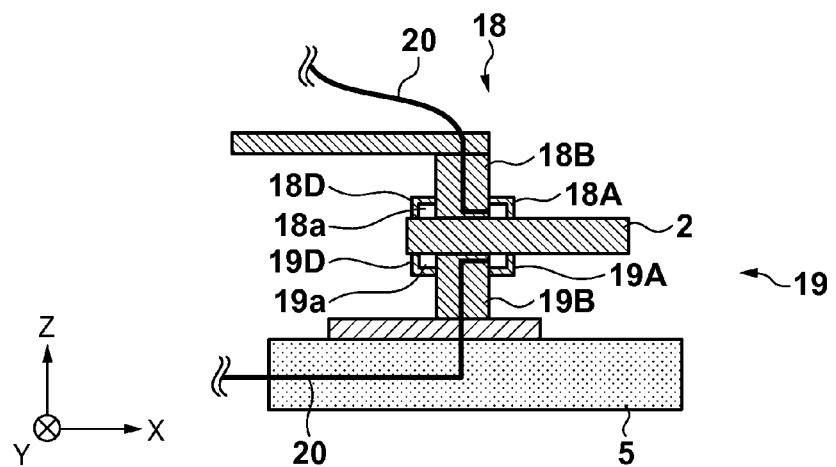
FIG. 5 is a sectional view showing the lower surface chuck and upper surface clamp in a state in which an original is held.
Figure 6:
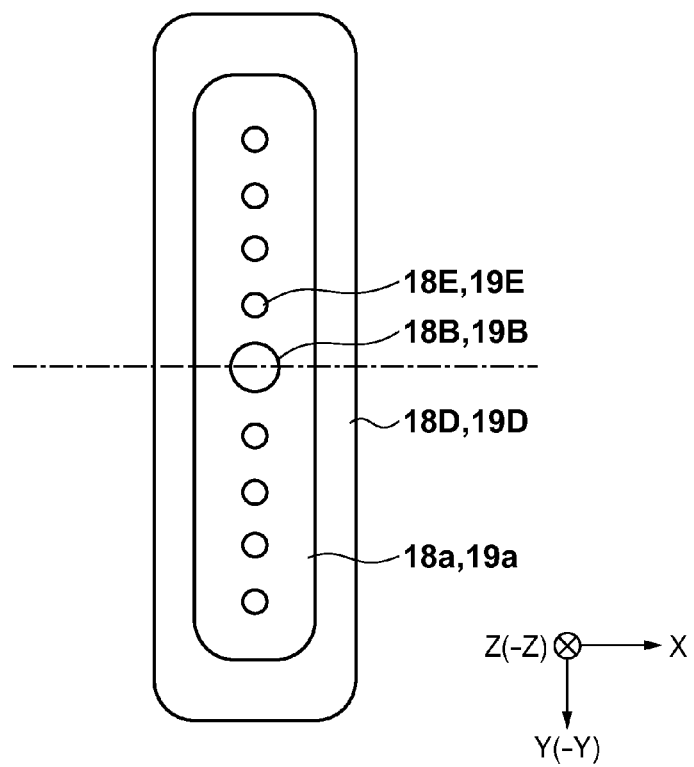
FIG. 6 is a view showing the arrangement of a portion of the upper surface clamp (lower surface chuck) that contacts the surface of an original.

The arrangements of the lower surface chuck 19 and upper surface clamp 18 will be explained with reference to FIGS. 5 and 6. FIG. 5 is an enlarged sectional view showing the lower surface chuck 19 and upper surface clamp 18 in a state in which the original 2 is held. FIG. 6 is a view showing the arrangement of a portion of the upper surface clamp 18 (lower surface chuck 19) that contacts the surface of the original 2. In the first embodiment, a portion which contacts the surface of the original 2 has the same arrangement in the upper surface clamp 18 and lower surface chuck 19.

The upper surface clamp 18 can include a positioning pin 18B (first positioning member), and a thin plate-like elastic member 18A (first enclosing member). The positioning pin 18B has a function of positioning the original 2 in a direction (Z direction) perpendicular to the surface of the original 2 when the positioning pin 18B contacts the upper surface of the original 2. The thin plate-like elastic member 18A serving as the first enclosing member defines the first enclosed space (vacuum trench 18a) around the positioning pin 18B (see FIG. 5). A projecting portion 18D is arranged at the periphery of the thin plate-like elastic member 18A, and the lower surface of the projecting portion 18D serves as a surface which contacts the original 2. As shown in FIG. 6, a plurality of small-diameter pins 18E are arranged at part inside the vacuum trench 18a, and their leading edges are configured to contact the original 2.

Similarly, the lower surface chuck 19 can include a positioning pin 19B (second positioning member), and a thin plate-like elastic member 19A. The positioning pin 19B serving as the second positioning member is fixed and arranged on the original stage, and has a function of positioning the original 2 in a direction (Z direction) perpendicular to the surface of the original 2 when the positioning pin 19B contacts the lower surface of the original. The thin plate-like elastic member 19A serving as the second enclosing member defines the second enclosed space (vacuum trench 19a) around the positioning pin 19B (see FIG. 5). A projecting portion 19D is arranged at the periphery of the thin plate-like elastic member 19A, and the upper surface of the projecting portion 19D serves as a surface which contacts the original 2. As shown in FIG. 6, a plurality of small-diameter pins 19E are arranged at part inside the vacuum trench 19a, and their leading edges are configured to contact the original 2.

Figure 14:
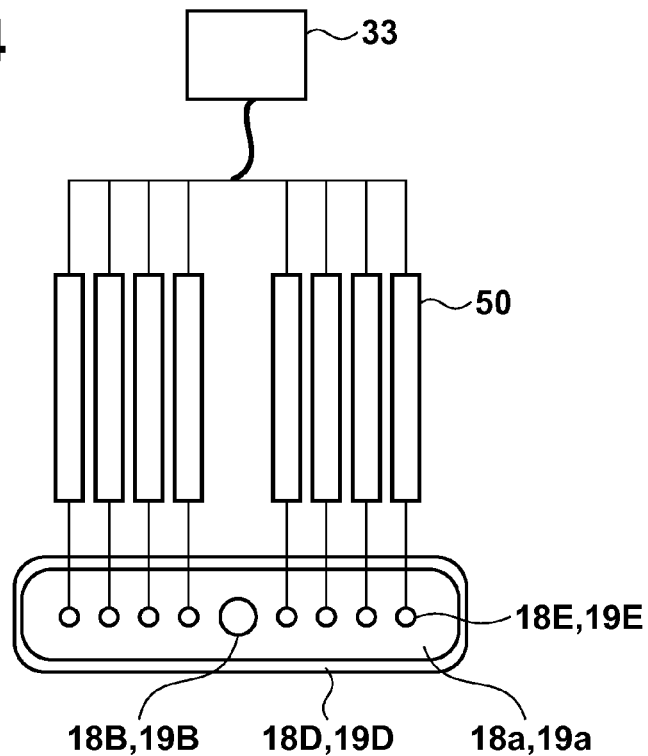
FIG. 14 is a view showing an example of the arrangement of the portion of the upper surface clamp (lower surface chuck) that contacts the surface of an original, and the pressure regulating unit.

The arrangement of the pressure regulating unit 50 (for example, vacuum valve) which regulates an internal pressure in each of the vacuum trench 18a of the upper surface clamp 18 and the vacuum trench 19a of the lower surface chuck will be explained with reference to FIGS. 12 to 14. FIGS. 12 to 14 are views each showing an example of the arrangement of a portion of the upper surface clamp 18 (lower surface chuck 19) that contacts the surface of the original 2, and the pressure regulating unit 50. For example, a gas in the vacuum trench 18a of the upper surface clamp passes through a hole formed in each of the plurality of pins 18E formed at part inside the vacuum trench 18a, and reaches the vacuum source 33 via the pressure regulating unit 50 and pipe 20. The pressure regulating unit 50 may be arranged commonly for the plurality of pins 18E, as shown in FIG. 12, commonly for every several pins 18E, as shown in FIG. 13, or independently for each pin 18E, as shown in FIG. 14.

Next, a moving mechanism of moving the upper surface clamps 18 from positions (positions (operating positions) facing the upper surface) at which the upper surface clamps 18 contact the upper surface of the original 2, to positions (positions (evacuation positions) not facing the upper surface) at which the upper surface clamps 18 do not contact the upper surface. For example, at the time of exchanging the original 2, the upper surface clamps 18 need to be evacuated to the positions not facing the upper surface of the original 2. In FIG. 2, for example, driving units 21 (for example, air cylinders) can move the upper surface clamps 18 in a direction (for example, ±X directions) parallel to the surface of the original 2. As shown in FIG. 4, after the upper surface clamps 18 are evacuated from the original 2, the original 2 can be recovered by a transport direction (not shown) from above the original 2 or from the ±Y directions. When moving the upper surface clamps 18 by the driving units 21, the movement of the upper surface clamps 18 in the ±X directions may be smoothly. For this purpose, the upper surface clamps 18 have looseness (play in the ±Y directions).

However, the upper surface clamps 18 having this arrangement may move in the ±Y directions with respect to the lower surface chucks 19 by the amount of the looseness when the substrate 3 is exposed while the original 2 is moved. More specifically, when the substrate 3 is exposed, if the upper surface clamps 18 move with respect to the lower surface chucks 19 in a direction (Y direction) in which the original stage 5 moves, the original 2 may be displaced or distorted, decreasing the overlay precision. To prevent this, the original holding apparatus 31 can include fixing units 23 which fix the upper surface clamps with respect to the lower surface chucks. The arrangement of the fixing units 23, and fixation of the upper surface clamps 18 by the fixing units 23 will be described with reference to FIGS. 7 and 8. FIG. 7 is a view showing the fixing units 23 before fixing the upper surface clamps 18. FIG. 8 is a view showing the fixing units 23 in a state in which the upper surface clamps 18 are fixed. As shown in FIG. 7, each fixing unit 23 can include a stopper 23a whose position is fixed with respect to the lower surface chuck 19, and an actuator 23b which moves the upper surface clamp 18 in, for example, the Y direction by applying a force to a corresponding connection portion 18f connected to the upper surface clamp 18. The stopper 23a and actuator 23b are arranged in the Y direction to sandwich the connection portion 18f connected to the upper surface clamp 18. As shown in FIG. 8, the fixing unit 23 can fix the position of the upper surface clamp 18 with respect to the lower surface chuck 19 by pressing the connection portion 18f against the stopper 23a by the actuator 23b. That is, the fixing unit 23 has a function of preventing relative displacement of the upper surface clamp 18 and lower surface chuck 19. The original holding apparatus 31 therefore functions as a rigid body in the direction (Y direction) in which the original stage 5 moves.

In the original holding apparatus 31 having this arrangement, while the lower surface chucks 19 vacuum-chuck the lower surface of the original 2 and the upper surface clamps 18 vacuum-chuck the upper surface of the original 2, the fixing units 23 fix the positions of the upper surface clamps 18 with respect to the lower surface chucks 19. In a conventional original holding apparatus, a force (original holding force of the second holding unit) for holding the original 2 by the upper surface clamps 18, and a force (original holding force of the first holding unit) for holding the original 2 by the lower surface chucks 19 are set to be equal to each other, and the fixing units 23 fix the upper surface clamps 18. That is, in the conventional original holding apparatus, the vacuum chucking force of the upper surface clamps 18 and the vacuum chucking force of the lower surface chucks 19 are set to be equal to each other, and the fixing units 23 fix the upper surface clamps 18. In the conventional original holding apparatus, when fixing the upper surface clamps 18 by the fixing units 23, the upper surface clamps 18 may move with respect to the lower surface chucks 19 to damage the surface (upper or lower surface) of the original 2. To prevent this, the original holding apparatus 31 according to the first embodiment adjusts the vacuum chucking force of the upper surface clamps 18 when fixing the upper surface clamps 18 by the fixing units 23. For example, the original holding apparatus 31 according to the first embodiment adjusts the vacuum chucking force of the upper surface clamps 18 to be smaller than the vacuum chucking force of the lower surface chucks 19. In this state, the original holding apparatus 31 fixes the upper surface clamps 18 by the fixing units 23. After fixing the upper surface clamps 18 by the fixing units 23, the original holding apparatus 31 increases the vacuum chucking force of the upper surface clamps 18 to be close to the vacuum chucking force of the lower surface chucks 19. That is, a vacuum chucking force of the upper surface clamps 18 after fixation by the fixing units 23 is adjusted to be larger than a vacuum chucking force of the upper surface clamps 18 before fixation by the fixing units 23. By fixing the upper surface clamps 18 by the fixing units 23 in a state in which the vacuum chucking force of the upper surface clamps 18 is adjusted, the possibility at which the original 2 is damaged when holding the original 2 can be reduced. Examples when the original holding apparatus 31 according to the first embodiment holds the original 2 will be explained below.

Example 1

Figure 9:
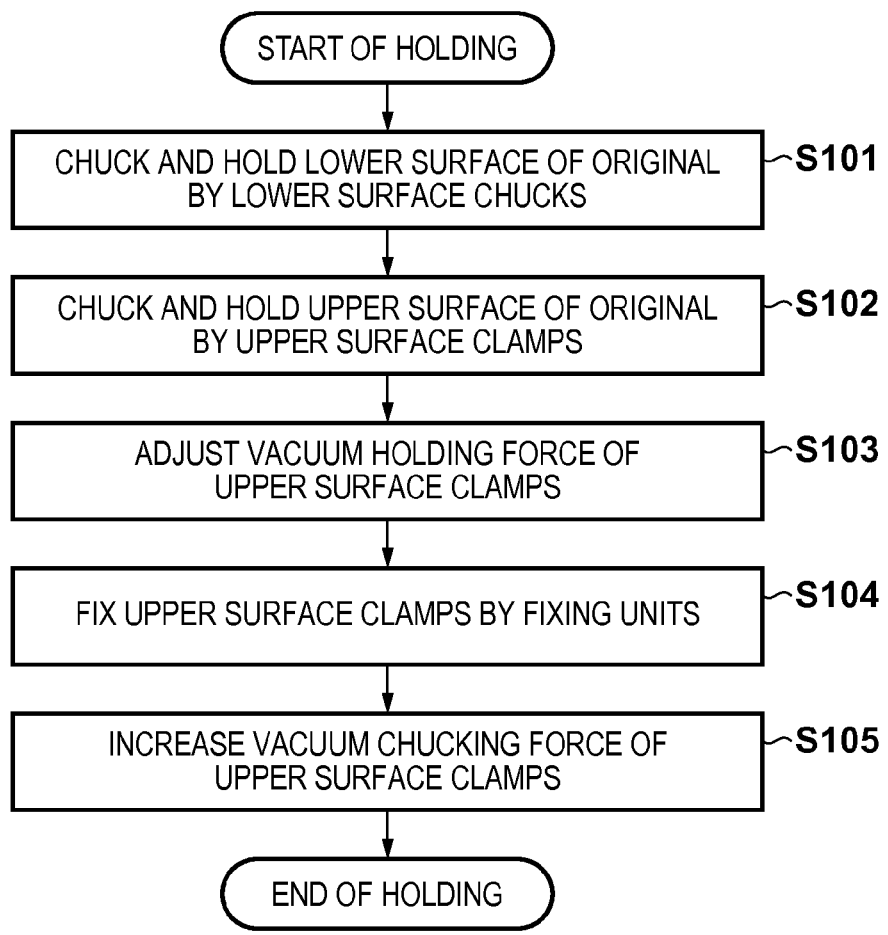
FIG. 9 is a flowchart showing an example of steps of holding an original by the original holding apparatus according to the first embodiment.

FIG. 9 is a flowchart showing an example of steps of holding an original 2 by an original holding apparatus 31 according to the first embodiment. In step S101, a control unit 32 controls the vacuum chucking force of lower surface chucks 19 so as to chuck and hold the lower surface of the original 2 transported onto an original stage 5 by a transport mechanism. In step S102, the control unit 32 arranges upper surface clamps 18 on the upper surface of the original 2 by moving mechanisms (driving units 21), and controls the vacuum chucking force of the upper surface clamps 18 to chuck and hold the upper surface of the original 2. In step S103, the control unit 32 adjusts the vacuum chucking force of the upper surface clamps 18. That is, the control unit 32 adjusts the vacuum chucking force of the upper surface clamps 18 to be smaller than the vacuum chucking force of the lower surface chucks 19, and to be smaller than a vacuum chucking force of the upper surface clamps 18 after fixing the upper surface clamps 18 by fixing units 23. In step S104, the control unit 32 fixes the upper surface clamps 18 by the fixing units 23. That is, the control unit 32 fixes the upper surface clamps 18 by pressing connection portions 18f of the upper surface clamps 18 against stoppers 23a by actuators 23b. In step S105, the control unit 32 increases the vacuum chucking force of the upper surface clamps 18 to be close to the vacuum chucking force of the lower surface chucks 19. That is, a vacuum chucking force of the upper surface clamps 18 after fixation by the fixing units 23 is adjusted to be larger than a vacuum chucking force of the upper surface clamps 18 before fixation by the fixing units 23. By adjusting in this manner the vacuum chucking force of the upper surface clamps 18 when fixing the upper surface clamps 18 by the fixing units 23, the original holding apparatus 31 according to the first embodiment can reduce the possibility at which the original 2 is damaged when holding the original 2.

In the flowchart of FIG. 9, the step of pressing the connection portions 18f of the upper surface clamps 18 against the stoppers 23a by the actuators 23b may be performed before (between steps S101 and S102) controlling the chucking force of the upper surface clamps to chuck the upper surface of the original 2. That is, before the start of holding the original by the upper surface clamps 18, the step of pressing the connection portions 18f of the upper surface clamps 18 against the stoppers 23a by the actuators 23b may be performed in a state in which the upper surface clamps 18 do not contact the upper surface of the original 2. When fixing the upper surface clamps 18 by the fixing units 23 (step S104), the amount by which the upper surface clamps 18 move with respect to the original 2 can be decreased. That is, the amount by which the upper surface clamps 18 move with respect to the original 2 in a state in which the upper surface clamps 18 contact the upper surface of the original 2 can be decreased. As a result, the possibility at which the surface of the original 2 is damaged can be further reduced.

Example 2

Figure 10:
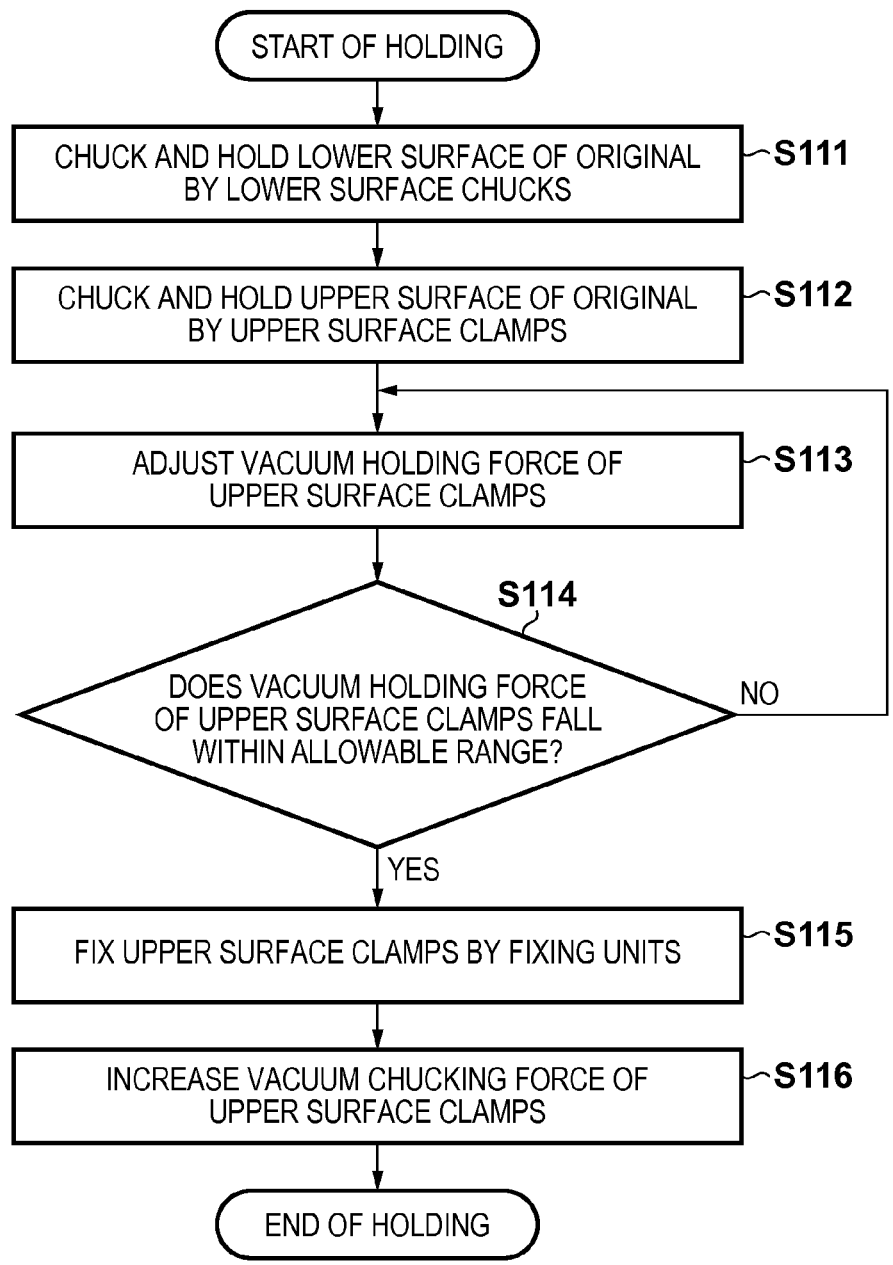
FIG. 10 is a flowchart showing an example of steps of holding an original by the original holding apparatus according to the first embodiment.

FIG. 10 is a flowchart showing an example of steps of holding an original 2 by an original holding apparatus 31 according to the first embodiment. Steps S111 to S113 in FIG. 10 are the same as steps S101 to S103 in FIG. 9, and a description thereof will not be repeated. In step S114, a control unit 32 determines whether the vacuum chucking force of upper surface clamps 18 falls within an allowable range. For example, the allowable range of the vacuum chucking force can be set in advance by experiment or the like so that the possibility at which the upper surface of the original 2 is damaged by fixation of the upper surface clamps 18 by fixing units 23 becomes equal to or lower than a threshold. For example, this determination may be made based on an output from a pressure sensor arranged in a vacuum trench 18a of the upper surface clamp 18, or an output from a pressure regulating unit 50 which regulates an internal pressure in the vacuum trench 18a of the upper surface clamp 18. If the vacuum chucking force of the upper surface clamps 18 does not fall within the allowable range in step S114, the process returns to step S113, and the control unit 32 adjusts again the vacuum chucking force of the upper surface clamps 18. If the vacuum chucking force of the upper surface clamps 18 falls within the allowable range in step S114, the process advances to step S115.

In step S115, the control unit 32 fixes the upper surface clamps 18 by the fixing units 23. That is, the control unit 32 fixes the upper surface clamps 18 by pressing connection portions 18f of the upper surface clamps 18 against stoppers 23a by actuators 23b. In step S116, the control unit 32 increases the vacuum chucking force of the upper surface clamps 18 to be close to the vacuum chucking force of lower surface chucks 19. That is, a vacuum chucking force of the upper surface clamps 18 after fixation by the fixing units 23 is adjusted to be larger than a vacuum chucking force of the upper surface clamps 18 before fixation by the fixing units 23. As described above, in Example 2, the control unit 32 determines whether the vacuum chucking force of the upper surface clamps 18 falls within the allowable range. This can prevent fixation of the upper surface clamps 18 in a state in which the vacuum chucking force of the upper surface clamps 18 do not fall within the allowable range. That is, in Example 2, the possibility at which the original 2 is damaged when holding the original 2 can be further reduced, compared to Example 1.

Example 3

Figure 11:
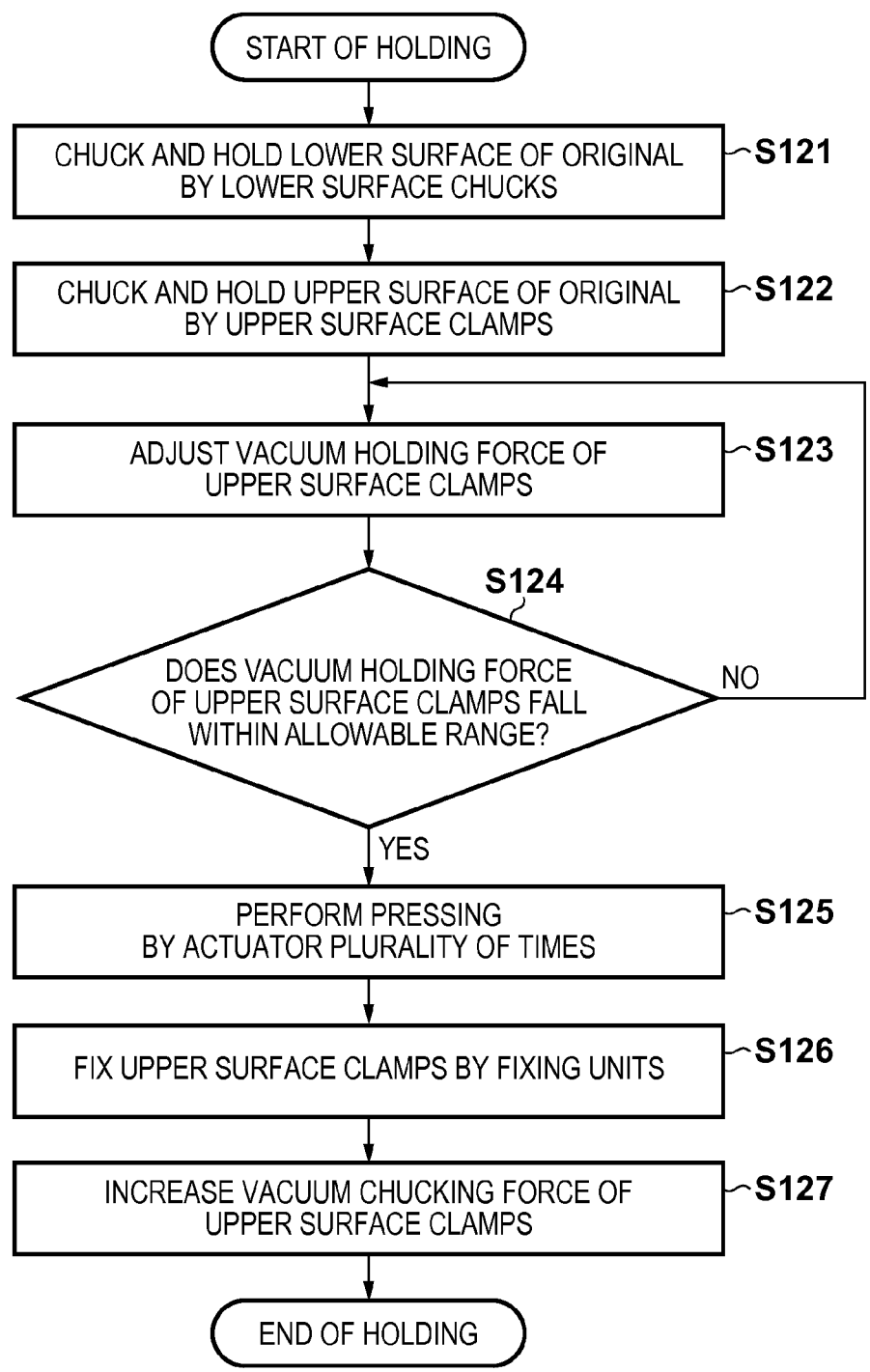
FIG. 11 is a flowchart showing an example of steps of holding an original by the original holding apparatus according to the first embodiment.

FIG. 11 is a flowchart showing an example of steps of holding an original 2 by an original holding apparatus 31 according to the first embodiment. Steps S121 to S124 in FIG. 11 are the same as steps S111 to S114 in FIG. 10, and a description thereof will not be repeated. In step S125, a control unit 32 controls fixing units 23 to perform a plurality of times a step of pressing connection portions 18f of upper surface clamps 18 against stoppers 23a by actuators 23b before fixing the upper surface clamps 18 by the fixing units 23. The pressing by the actuators 23b is performed a plurality of times in order to reduce the distortion of the upper surface clamps 18 and an original 2 by releasing once the distortion of the upper surface clamps 18 and then fixing again the upper surface clamps 18.

In step S126, the control unit 32 fixes the upper surface clamps 18 by the fixing units 23. That is, the control unit 32 fixes the upper surface clamps 18 by pressing the connection portions 18f of the upper surface clamps 18 against the stoppers 23a by the actuators 23b (by bringing the connection portions 18f into contact with the stoppers 23a). In step S127, the control unit 32 increases the vacuum chucking force of the upper surface clamps 18 to be close to the vacuum chucking force of lower surface chucks 19. That is, a vacuum chucking force of the upper surface clamps 18 after fixation by the fixing units 23 is adjusted to be larger than a vacuum chucking force of the upper surface clamps 18 before fixation by the fixing units 23. In this way, in Example 3, the upper surface clamps 18 are fixed through a plurality of times of pressing by the actuators 23b. Accordingly, the connection portions 18f of the upper surface clamps 18 can reliably contact the stoppers 23a, and the upper surface clamps 18 can be arranged at target positions on the original 2.

As described above, the original holding apparatus 31 according to the first embodiment adjusts the vacuum chucking force of the upper surface clamps 18 when fixing the upper surface clamps 18 by the fixing units 23. For example, the original holding apparatus 31 according to the first embodiment adjusts the vacuum chucking force of the upper surface clamps 18 to be smaller than the vacuum chucking force of the lower surface chucks 19. In this state, the original holding apparatus 31 fixes the upper surface clamps 18 by the fixing units 23. After fixing the upper surface clamps 18 by the fixing units 23, the original holding apparatus 31 increases the vacuum chucking force of the upper surface clamps 18 to be close to the vacuum chucking force of the lower surface chucks 19. This can reduce the possibility at which the original 2 is damaged when the original holding apparatus 31 holds the original 2.

When fixing the upper surface clamps 18 by the fixing units 23, the original holding apparatus 31 according to the first embodiment adjusts the vacuum chucking force of the upper surface clamps 18. However, the present invention is not limited to this, and the original holding apparatus 31 may adjust the vacuum chucking force of the lower surface chucks 19. In this case, the original holding apparatus adjusts the vacuum chucking force of the lower surface chucks 19 to be smaller than the vacuum chucking force of the upper surface clamps 18. In this state, the original holding apparatus fixes the upper surface clamps 18 by the fixing units 23. After fixing the upper surface clamps 18 by the fixing units 23, the original holding apparatus increases the vacuum chucking force of the lower surface chucks 19 to be close to the vacuum chucking force of the upper surface clamps 18. Even by adjusting the vacuum chucking force of the lower surface chucks 19, the possibility at which the original 2 is damaged when the original holding apparatus 31 holds the original 2 can be reduced similarly to adjusting the vacuum chucking force of the upper surface clamps 18.

The first embodiment has described an example in which the upper surface clamps 18 vacuum-chuck the upper surface (second surface) of the original 2, and the lower surface chucks 19 vacuum-chuck the lower surface (first surface) of the original 2. However, the present invention is not limited to this, and the upper surface clamps 18 and lower surface chucks 19 may vacuum-chuck the same surface (first or second surface) of the original 2. Even in this case, the possibility at which the original 2 is damaged can be reduced by holding the original 2 by the above-described method. Further, the first and second surfaces to be vacuum-chucked are not limited to the upper and lower surfaces of the original 2, and can include the side surface of the original 2. That is the first and second surfaces to be vacuum-chucked may be any of the three, upper, lower, and side surfaces of the original 2.

The first embodiment has described an example in which the upper surface clamps 18 and lower surface chucks 19 hold the original 2 by the vacuum chucking force. However, the present invention is not limited to this. It is only necessary that the upper surface clamps 18 and lower surface chucks 19 hold the original 2 by at least either of the vacuum chucking force and electrostatic chucking force. The original 2 may be held by only the electrostatic chucking force, or by both the vacuum chucking force and electrostatic chucking force.

Second Embodiment

Chucking conditions for holding an original 2 (the vacuum chucking force of upper surface clamps 18 and the vacuum chucking force of lower surface chucks 19) may be the same when the same original 2 is used. That is, the vacuum chucking force of the upper surface clamps 18 and the vacuum chucking force of the lower surface chucks 19 may be managed for each original. According to the second embodiment, in an exposure apparatus 100 (original holding apparatus 31), a control unit 32 stores the vacuum chucking force of the upper surface clamps 18 and the vacuum chucking force of the lower surface chucks 19 for each original. Here, the vacuum chucking force of the upper surface clamps 18 stored by the control unit 32 can include a vacuum chucking force of the upper surface clamps 18 when fixing the upper surface clamps 18 by fixing units 23, and a vacuum chucking force of the upper surface clamps 18 after fixing the upper surface clamps 18 by the fixing units 23.

Figure 15:
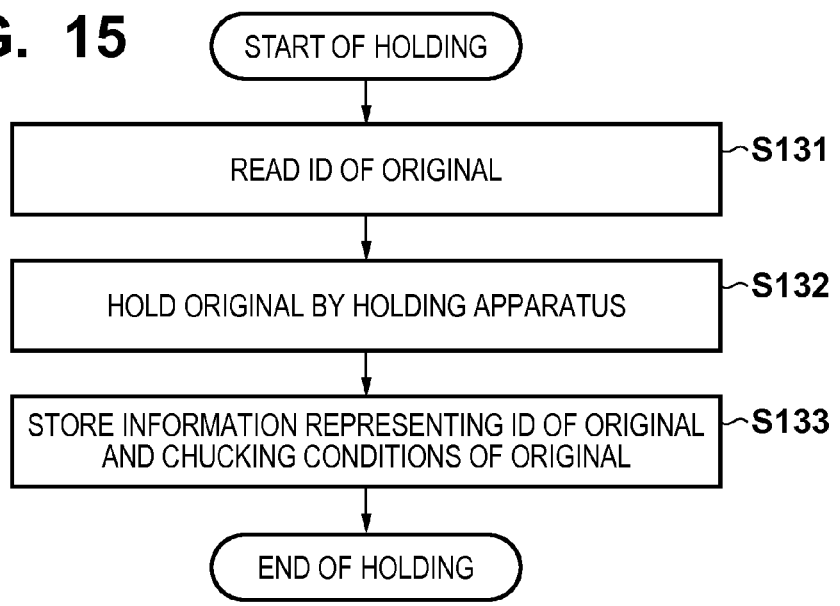
FIG. 15 is a flowchart showing steps of managing the chucking conditions of an original in the exposure apparatus.

FIG. 15 is a flowchart showing steps of managing the chucking conditions of the original 2 in the exposure apparatus 100. In step S131, the control unit 32 reads the ID of the original 2 transported onto an original stage 5 by a transport mechanism. In step S132, the control unit 32 controls the original holding apparatus 31 (upper surface clamps 18, lower surface chucks 19, and fixing units 23) to hold the original 2 according to one of the flowcharts shown in FIGS. 9 to 11. In step S133, the control unit 32 stores information representing the ID of the original 2, the vacuum chucking force of the upper surface clamps 18, and the vacuum chucking force of the lower surface chucks 19. In this fashion, the control unit 32 stores, for each original, information representing the vacuum chucking force of the upper surface clamps 18 and the vacuum chucking force of the lower surface chucks 19. When the original holding apparatus 31 holds again the original 2 which has been used once, the information stored by the control unit 32 can be used. Since the chucking conditions for holding the original 2 can be reproduced, the reproducibility of a state in which the original holding apparatus 31 holds the original 2 can be improved.

Embodiment of Method of Manufacturing Article

A method of manufacturing an article according to an embodiment of the present invention is suitable for manufacturing an article such as a microdevice (for example, a semiconductor device) or an element having a microstructure. The method of manufacturing an article according to the embodiment includes a step of forming a latent image pattern on a photosensitive agent applied to a substrate by using the above-described scanning exposure apparatus (a step of exposing a substrate), and a step of developing the substrate on which the latent image pattern has been formed in the preceding step. Further, this manufacturing method includes other well-known steps (for example, oxidization, deposition, vapor deposition, doping, planarization, etching, resist removal, dicing, bonding, and packaging). The method of manufacturing an article according to the embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-232581 filed on Nov. 8, 2013, which is hereby incorporated by reference herein in its entirety.

What is claimed is:

1. An original holding apparatus which holds an original, comprising:
   a first holding unit configured to hold the original;
   a second holding unit, being movable with respect to the first holding unit, configured to hold the original;
   a fixing unit configured to fix the second holding unit with respect to the first holding unit; and
   an adjustment unit configured to perform adjustment of at least one of an original holding force of the first holding unit and an original holding force of the second holding unit,
   wherein the adjustment unit performs the adjustment such that the original holding force of the second holding unit before fixing the second holding unit by the fixing unit is smaller than the original holding force of the first holding unit before fixing the second holding unit by the fixing unit, and performs the adjustment such that the original holding force of the second holding unit after fixing the second holding unit by the fixing unit is larger than the original holding force of the second holding unit before fixing the second holding unit by the fixing unit.

2. The apparatus according to claim 1, wherein
   the fixing unit includes:
   a stopper whose position is fixed with respect to the first holding unit; and
   an actuator configured to move the second holding unit by applying a force to a connection portion connected to the second holding unit,
   the stopper and the actuator are arranged to sandwich the connection portion, and
   the fixing unit fixes the second holding unit by pressing the connection portion against the stopper by the actuator.

3. The apparatus according to claim 2, wherein the fixing unit fixes the second holding unit through a plurality of times of pressing by the actuator.

4. The apparatus according to claim 1, wherein after fixing the second holding unit by the fixing unit, the adjustment unit performs the adjustment such that the original holding force of the second holding unit is close to the original holding force of the first holding unit.

5. The apparatus according to claim 1, wherein
   the original has a first surface and a second surface opposite to the first surface,
   the first holding unit holds the original by chucking the first surface, and
   the second holding unit holds the original by chucking the second surface.

6. The apparatus according to claim 5, wherein
   the first holding unit chucks the first surface by at least one of vacuum chuck and electrostatic chuck, and
   the second holding unit chucks the second surface by at least one of vacuum chuck and electrostatic chuck.

7. The apparatus according to claim 1, wherein the adjustment unit stores the original holding force of the second holding unit and the original holding force of the first holding unit for each original.

8. An original holding apparatus which holds an original, comprising:
   a first holding unit configured to hold the original;
   a second holding unit, being movable with respect to the first holding unit, configured to hold the original;
   a fixing unit configured to fix the second holding unit with respect to the first holding unit; and
   an adjustment unit configured to perform adjustment of at least one of an original holding force of the first holding unit and an original holding force of the second holding unit,
   wherein the adjustment unit performs the adjustment such that the original holding force of the first holding unit before fixing the second holding unit by the fixing unit is smaller than the original holding force of the second holding unit before fixing the second holding unit by the fixing unit, and performs the adjustment such that the original holding force of the first holding unit after fixing the second holding unit by the fixing unit is larger than the original holding force of the first holding unit before fixing the second holding unit by the fixing unit.

9. An exposure apparatus which exposes a substrate, comprising:
   an original holding apparatus defined in claim 1; and
   a projection optical system configured to project, to the substrate, a pattern of an original held by the original holding apparatus.

10. The apparatus according to claim 9, further comprising a stage configured to be movable while mounting the original holding apparatus,
    wherein the exposure apparatus performs exposure while scanning the original by the stage.

11. A method of manufacturing an article, the method comprising:
    exposing a substrate using an exposure apparatus;
    developing the exposed substrate in the exposing; and
    processing the developed substrate to manufacture the article,
    wherein the exposure apparatus exposes the substrate, and includes:
    an original holding apparatus configured to hold an original; and
    a projection optical system configured to project, to the substrate, a pattern of an original held by the original holding apparatus,
    wherein the original holding apparatus includes:
    a first holding unit configured to hold the original;
    a second holding unit, being movable with respect to the first holding unit, configured to hold the original;
    a fixing unit configured to fix the second holding unit with respect to the first holding unit; and
    an adjustment unit configured to perform adjustment of at least one of an original holding force of the first holding unit and an original holding force of the second holding unit,
    wherein the adjustment unit performs the adjustment such that the original holding force of the second holding unit before fixing the second holding unit by the fixing unit is smaller than the original holding force of the first holding unit before fixing the second holding unit by the fixing unit, and performs the adjustment such that the original holding force of the second holding unit after fixing the second holding unit by the fixing unit is larger than the original holding force of the second holding unit before fixing the second holding unit by the fixing unit.

12. An original holding method of holding an original, comprising the steps of:
    holding the original by a first holding unit;
    holding the original by a second holding unit which is movable with respect to the first holding unit;

fixing the second holding unit with respect to the first holding unit;
before fixing the second holding unit, performing adjustment of at least one of the original holding force of the first holding unit and the original holding force of the second holding unit such that the original holding force of the second holding unit before fixing the second holding unit is smaller than the original holding force of the first holding unit before fixing the second holding unit; and
after fixing the second holding unit, performing adjustment of the original holding force of the second holding unit such that the original holding force of the second holding unit after fixing the second holding unit is larger than the original holding force of the second holding unit before fixing the second holding unit.

13. An original holding method of holding an original, comprising the steps of:
holding the original by a first holding unit;
holding the original by a second holding unit which is movable with respect to the first holding unit;
fixing the second holding unit with respect to the first holding unit;
before fixing the second holding unit, performing adjustment of at least one of the original holding force of the first holding unit and the original holding force of the second holding unit such that the original holding force of the first holding unit before fixing the second holding unit is smaller than the original holding force of the second holding unit before fixing the second holding unit; and
after fixing the second holding unit, performing adjustment of the original holding force of the first holding unit such that the original holding force of the first holding unit after fixing the second holding unit is larger than the original holding force of the first holding unit before fixing the second holding unit.

14. A holding apparatus which holds a plate, comprising:
a first holding unit configured to hold the plate;
a second holding unit, being movable with respect to the first holding unit, configured to hold the plate;
a fixing unit configured to fix the second holding unit with respect to the first holding unit; and
an adjustment unit configured to perform adjustment of a holding force of the first holding unit, a holding force of the second holding unit or holding forces of the first and second holding units,
wherein the adjustment unit performs the adjustment such that the holding force of the second holding unit before fixing the second holding unit by the fixing unit is smaller than the holding force of the second holding unit after fixing the second holding unit by the fixing unit.

15. The apparatus according to claim 14, wherein the adjustment unit performs the adjustment such that the holding force of the second holding unit before fixing the second holding unit by the fixing unit is smaller than the holding force of the first holding unit before fixing the second holding unit by the fixing unit.

16. The apparatus according to claim 14, wherein the plate includes an original on which a pattern is formed.

17. A holding apparatus which holds a plate, comprising:
a first holding unit configured to hold the plate;
a second holding unit, being movable with respect to the first holding unit, configured to hold the plate;
a fixing unit configured to fix the second holding unit with respect to the first holding unit; and
an adjustment unit configured to perform adjustment of a holding force of the first holding unit, a holding force of the second holding unit or holding forces of the first and second holding units,
wherein the adjustment unit performs the adjustment such that the holding force of the first holding unit before fixing the second holding unit by the fixing unit is smaller than the holding force of the first holding unit after fixing the second holding unit by the fixing unit.

18. The apparatus according to claim 17, wherein the adjustment unit performs the adjustment such that the holding force of the second holding unit before fixing the second holding unit by the fixing unit is smaller than the holding force of the first holding unit before fixing the second holding unit by the fixing unit.

19. The apparatus according to claim 17, wherein the plate includes an original on which a pattern is formed.

20. A method of manufacturing an article, the method comprising:
exposing a substrate using an exposure apparatus;
developing the exposed substrate in the exposing; and
processing the developed substrate to manufacture the article,
wherein the exposure apparatus exposes the substrate, and includes:
a holding apparatus configured to hold an original; and
a projection optical system configured to project, to the substrate, a pattern of an original held by the holding apparatus,
wherein the holding apparatus includes:
a first holding unit configured to hold the original;
a second holding unit, being movable with respect to the first holding unit, configured to hold the original;
a fixing unit configured to fix the second holding unit with respect to the first holding unit; and
an adjustment unit configured to perform adjustment of a holding force of the first holding unit, a holding force of the second holding unit or holding forces of the first and second holding units,
wherein the adjustment unit performs the adjustment such that the holding force of the second holding unit before fixing the second holding unit by the fixing unit is smaller than the holding force of the second holding unit after fixing the second holding unit by the fixing unit.

21. A method of manufacturing an article, the method comprising:
exposing a substrate using an exposure apparatus;
developing the exposed substrate in the exposing; and
processing the developed substrate to manufacture the article,
wherein the exposure apparatus exposes the substrate, and includes:
a holding apparatus configured to hold an original; and
a projection optical system configured to project, to the substrate, a pattern of an original held by the holding apparatus,
wherein the holding apparatus includes:
a first holding unit configured to hold the original;
a second holding unit, being movable with respect to the first holding unit, configured to hold the original;
a fixing unit configured to fix the second holding unit with respect to the first holding unit; and
an adjustment unit configured to perform adjustment of a holding force of the first holding unit, a holding force of the second holding unit or holding forces of the first and second holding units, wherein the adjustment unit performs the adjustment such that the holding force of the first holding unit before fixing the second holding unit by the fixing unit is smaller than the holding force of the first holding unit after fixing the second holding unit by the fixing unit.

22. A holding method of holding a plate, comprising the steps of:

holding the plate by a first holding unit;

holding the plate by a second holding unit which is movable with respect to the first holding unit;

fixing the second holding unit with respect to the first holding unit; and after fixing the second holding unit, performing adjustment of a holding force of the second holding unit such that the holding force of the second holding unit before fixing the second holding unit is smaller than the holding force of the second holding unit after fixing the second holding unit.

23. A holding method of holding a plate, comprising the steps of:

holding the plate by a first holding unit;

holding the plate by a second holding unit which is movable with respect to the first holding unit;

fixing the second holding unit with respect to the first holding unit; and after fixing the second holding unit, performing adjustment of a holding force of the first holding unit such that the holding force of the first holding unit before fixing the second holding unit is smaller than the holding force of the first holding unit after fixing the second holding unit.

* * * * *